(12) United States Patent
Colonna et al.

(10) Patent No.: US 6,496,066 B2
(45) Date of Patent: Dec. 17, 2002

(54) FULLY DIFFERENTIAL OPERATIONAL AMPLIFIER OF THE FOLDED CASCODE TYPE

(75) Inventors: Vittorio Colonna, Landriano; Andrea Baschirotto, Tortona; Paolo Cusinato, Sestri Levante; Gabriele Gandolfi, Siziano, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/888,087

(22) Filed: Jun. 21, 2001

(65) Prior Publication Data

US 2002/0005757 A1 Jan. 17, 2002

(30) Foreign Application Priority Data

Jun. 23, 2000 (EP) .............................................. 00830439

(51) Int. Cl.$^7$ ................................................. H03F 3/45
(52) U.S. Cl. ........................................ 330/253; 330/257
(58) Field of Search .................................. 330/253, 257

(56) References Cited

U.S. PATENT DOCUMENTS

| | | | |
|---|---|---|---|
| 4,599,572 A | * | 7/1986 | Nakayama |
| 5,166,635 A | * | 11/1992 | Shih |
| 5,168,243 A | * | 12/1992 | Feliz et al. |
| 5,374,897 A | * | 12/1994 | Moraveji |
| 5,748,040 A | | 5/1998 | Leung .................. 330/253 |

FOREIGN PATENT DOCUMENTS

EP    0664608    7/1995

* cited by examiner

*Primary Examiner*—Patricia Nguyen
(74) *Attorney, Agent, or Firm*—Lisa K. Jorgenson; Robert Iannucci; Seed Intellectual Property Law Group PLLC

(57) ABSTRACT

The present invention refers to a fully differential operational amplifier of the folded cascode type.

In one embodiment the fully differential operational amplifier comprises: a differential input stage able to drive a differential output stage; said differential output stage includes a first branch having at least a first and a second transistor, and a second branch having at least a third and a fourth transistor; said first and second branch are coupled to a first and a second voltage source; a feedback circuit of said first, second, third and fourth transistors that is constituted by a single amplifier having four inputs and four outputs, said four inputs taking the voltages present on a terminal of said first, second, third and fourth transistors, and providing voltages to the control elements of said first, second, third and fourth transistors, which voltages depend on the input voltages of said four inputs.

23 Claims, 4 Drawing Sheets

US 6,496,066 B2

FULLY DIFFERENTIAL OPERATIONAL AMPLIFIER OF THE FOLDED CASCODE TYPE

TECHNICAL FIELD

The present invention refers to a fully differential operational amplifier of the folded cascode type.

BACKGROUND OF THE INVENTION

In applications where it is necessary to have high direct current ("DC") gain without bandwidth restrictions, single stage amplifiers are used with the output transistors cascode connected, and with a feedback loop for each output transistor, to increase the output impedance. These feedback loops are commonly called gain amplifier circuits (gain boosting circuits) because of their function.

A fully differential operational amplifier with a single stage includes four output transistors (two for each output). Therefore, four feedback loops are needed, which normally are realized by means of four unbalanced operational amplifiers. As disclosed in the U.S. Pat. No. 5,748,040, a further realization of the feedback loops is effected by replacing the four individual output operational amplifiers with two differential operational amplifiers. The principal advantages of this realization are a reduced current consumption and the use of a smaller silicon area.

SUMMARY OF THE INVENTION

According to the present invention, a reduced current consumption, the use of less silicon area, and other objectives are achieved by means of a fully differential operational amplifier of the folded cascode type comprising: a differential output stage; a differential input stage able to drive said output stage; said differential output stage including a first branch having at least a first and a second transistor and a second branch having at least a third and a fourth transistor; said first and second branches coupled to a first and to a second voltage source; and a feedback circuit of said first, second, third and fourth transistors wherein said feedback circuit is constituted by a single amplifier having four inputs and four outputs, said four inputs taking the voltages present on terminals of said first, second, third and fourth transistors, and said four outputs each providing a voltage to the control elements of said first, second, third and fourth transistors, which said voltage depends on the value of the input voltage of said four inputs.

Such objectives are also achieved by means of an amplifier, having four inputs and four outputs, able to provide an output voltage that depends on the value of the input voltages of said four inputs wherein: said amplifier includes a first differential pair composed of a first and a second transistor having their drains respectively connected to two output terminals and coupled to the first voltage source through two current generators; the gates of said first and second transistors coupled to two input terminals; a second differential pair composed of a third and a fourth transistor having their drains connected respectively to two output terminals and coupled to the second voltage source through two current generators; the gates of said third and fourth transistors coupled to two input terminals; the sources of said first, second, third and fourth transistors connected together; and a voltage generator applied between the first voltage source and said transistor sources.

BRIEF DESCRIPTION OF THE DRAWINGS

The features and the advantages of the present invention will be made more evident by the following detailed description of a particular embodiment, illustrated as a non-limiting example in the attached drawings, wherein.

DETAILED DESCRIPTION OF THE INVENTION

Figure 1:
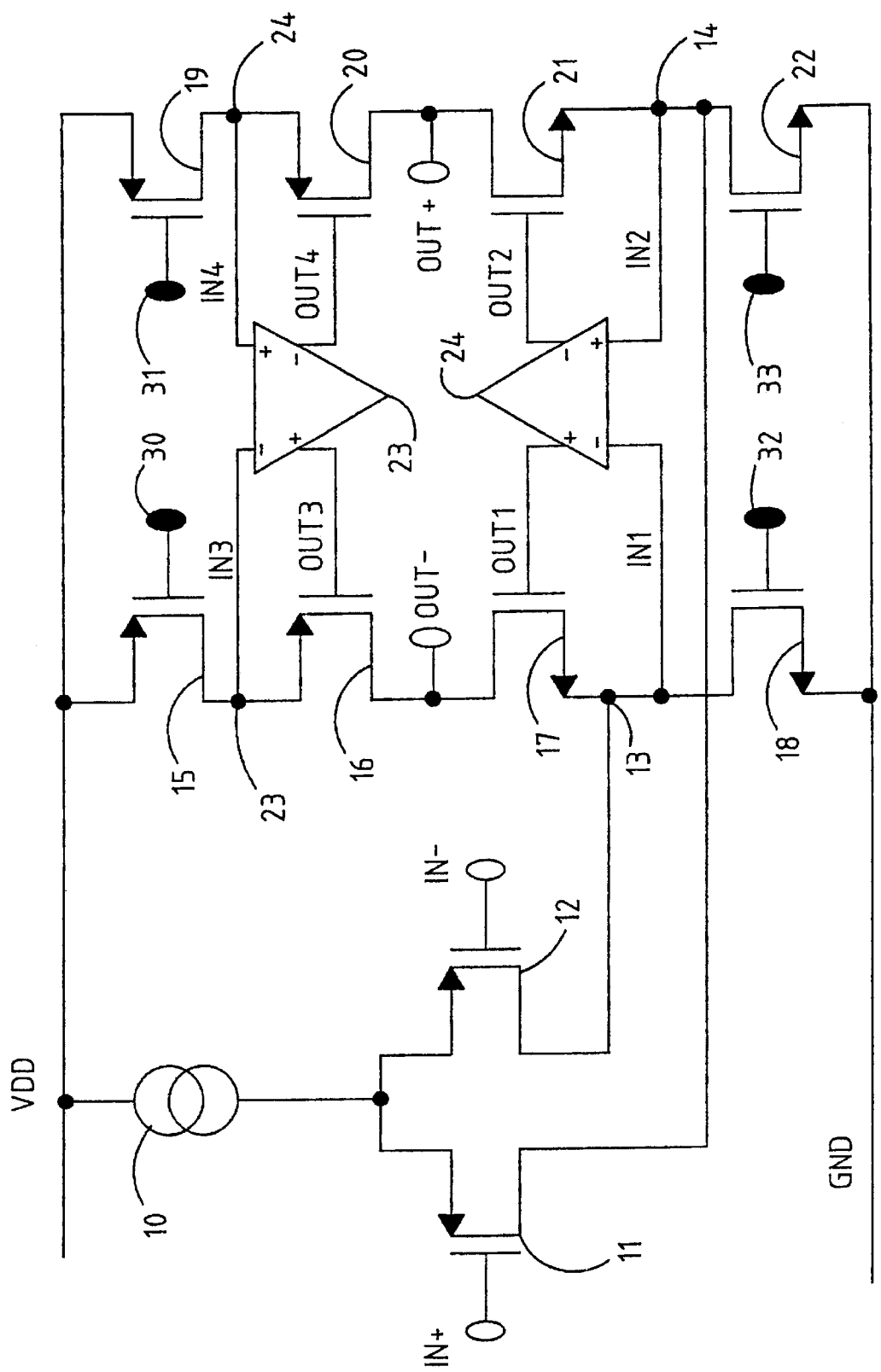
FIG. 1 illustrates a schematic circuit of a fully differential operational amplifier of the folded cascode type according to the known art.

Referring to FIG. 1, it is illustrated a schematic circuit of a fully differential operational amplifier of the folded cascode type according to the known art. A differential pair of transistors 11 and 12 are connected in a common source configuration with the sources connected to a terminal of a current generator 10, whose other terminal is connected to a first voltage source VDD. The drain of the transistor 11 is connected to a node 14, and the drain of the transistor 12 is connected to a node 13. The gate of the transistor 11 is connected to a positive input IN+, and the gate of the transistor 12 is connected to a negative input IN−.

To the node 13 is connected the drain of a transistor 18, and a source of transistor 18 is connected to a second voltage source GND. To the node 14 is connected the drain of a transistor 22, whose source is connected to the second voltage source GND.

To the first voltage source VDD is connected the source of a transistor 15, whose drain is connected to a node 23; to the first voltage source VDD is also connected the source of a transistor 19, whose drain is connected to a node 24. The gates 30, 31, 32 and 33 respectively belonging to the transistors 15, 19, 18 and 22 in FIG. 1 are left open for simplicity of representation, but they are to be connected to their relative bias voltages not shown, and they serve the function of current mirrors.

To the node 13 is also connected the source of a transistor 17, whose drain is connected to a negative output terminal OUT−. To this terminal OUT− is connected the drain of a transistor 16, whose source is connected to the node 23.

In an analogous configuration, on the other symmetrical branch, to the node 14 is connected the source of a transistor 21, whose drain is connected to a positive output terminal OUT+. To this terminal OUT+ is connected the drain of a transistor 20, whose source is connected to the node 24.

An operational amplifier 24 having differential output has an input IN1 connected to the node 13, an input IN2 connected to the node 14, an output OUT1 connected to the gate of the transistor 17, and an output OUT2 connected to the gate of the transistor 21. An operational amplifier 23 having differential output has an input IN3 connected to the node 23, an input IN4 connected to the node 24, an output OUT3 connected to the gate of the transistor 16, and an output OUT4 connected to the gate of the transistor 20.

The transistors 11, 12, 15, 16, 19 and 20 are, for instance, p-channel transistors, and the transistors 17, 18, 21 and 22 are, for instance, n-channel transistors.

FIG. 1 represents an example of a fully differential operational amplifier of the folded cascode type. However, other circuit configurations are possible which could be regarded as functionally equivalent.

Figure 2:
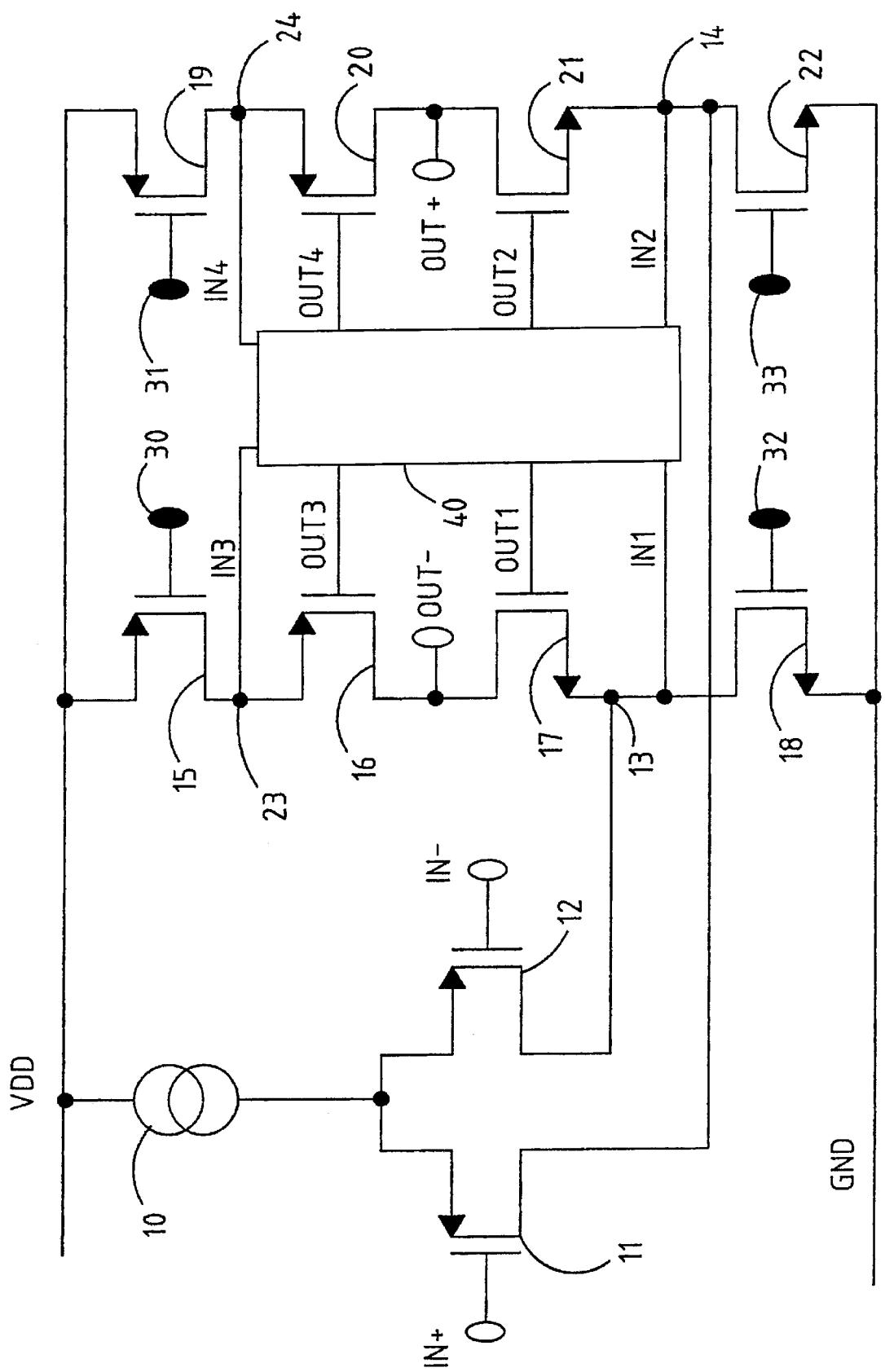
FIG. 2 illustrates a schematic circuit of a fully differential operational amplifier of the folded cascode type according to the present invention.

FIG. 2 shows a schematic circuit of a fully differential operational amplifier of the folded cascode type according to the present invention. It is of the type shown in FIG. 1, and, therefore, the corresponding elements have the same numerical references.

With respect to the schematic of FIG. 1, where are shown two operational amplifiers 23 and 24 having differential outputs which form the feedback loops (gain boosting circuits), the two operational amplifiers have been replaced, in FIG. 2, by a single amplifier 40 having four inputs IN1, IN2, IN3 and IN4 and four outputs OUT1, OUT2, OUT3 and OUT4.

Figure 3:
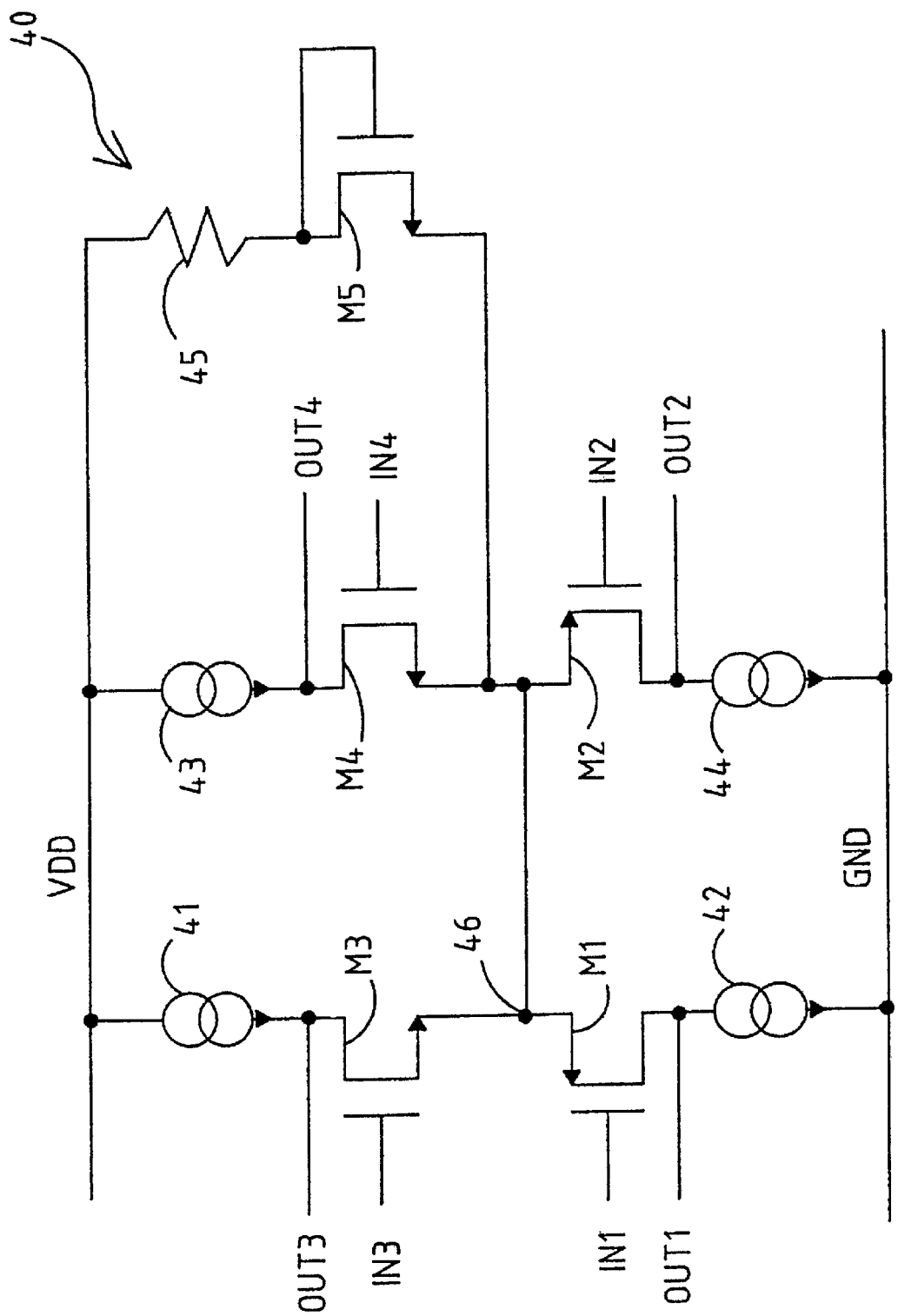
FIG. 3 illustrates a schematic circuit of an amplifier having four inputs and four outputs according to the present invention.

FIG. 3 shows a schematic circuit of the amplifier 40 having four inputs and four outputs according to the present invention.

The amplifier 40 is comprised of two symmetrical branches, the first branch having a current generator 41 connected on a side to the first voltage source VDD and connected on the other side to both the output OUT3 and the drain of a transistor M3, whose gate is connected to the input IN3 and whose source is connected to a node 46. To the node 46 is also connected the source of a transistor M1, whose gate is connected to the input IN1 and whose drain is connected to both the output OUT1 and a side of a current generator 42, whose other side is connected to the second voltage source GND. The second branch comprises a current generator 43 connected on a side to the first voltage source VDD and on the other side to both the output OUT4 and the drain of a transistor M4, whose gate is connected to the input IN4 and whose source is connected to the node 46. To the node 46 is also connected the source of a transistor M2, whose gate is connected to the input IN2 and whose drain is connected to both the output OUT2 and a side of a current generator 44, whose other side is connected to the second voltage source GND.

A resistor 45 is connected between the first voltage source VDD and a transistor M5 connected like a diode, having the gate and the drain connected to the resistor 45 and the source connected to the node 46.

The transistors M1 and M2 are, for instance, p-channel transistors, and the transistors M3, M4 and M5 are, for instance, n-channel transistors.

Figure 4:
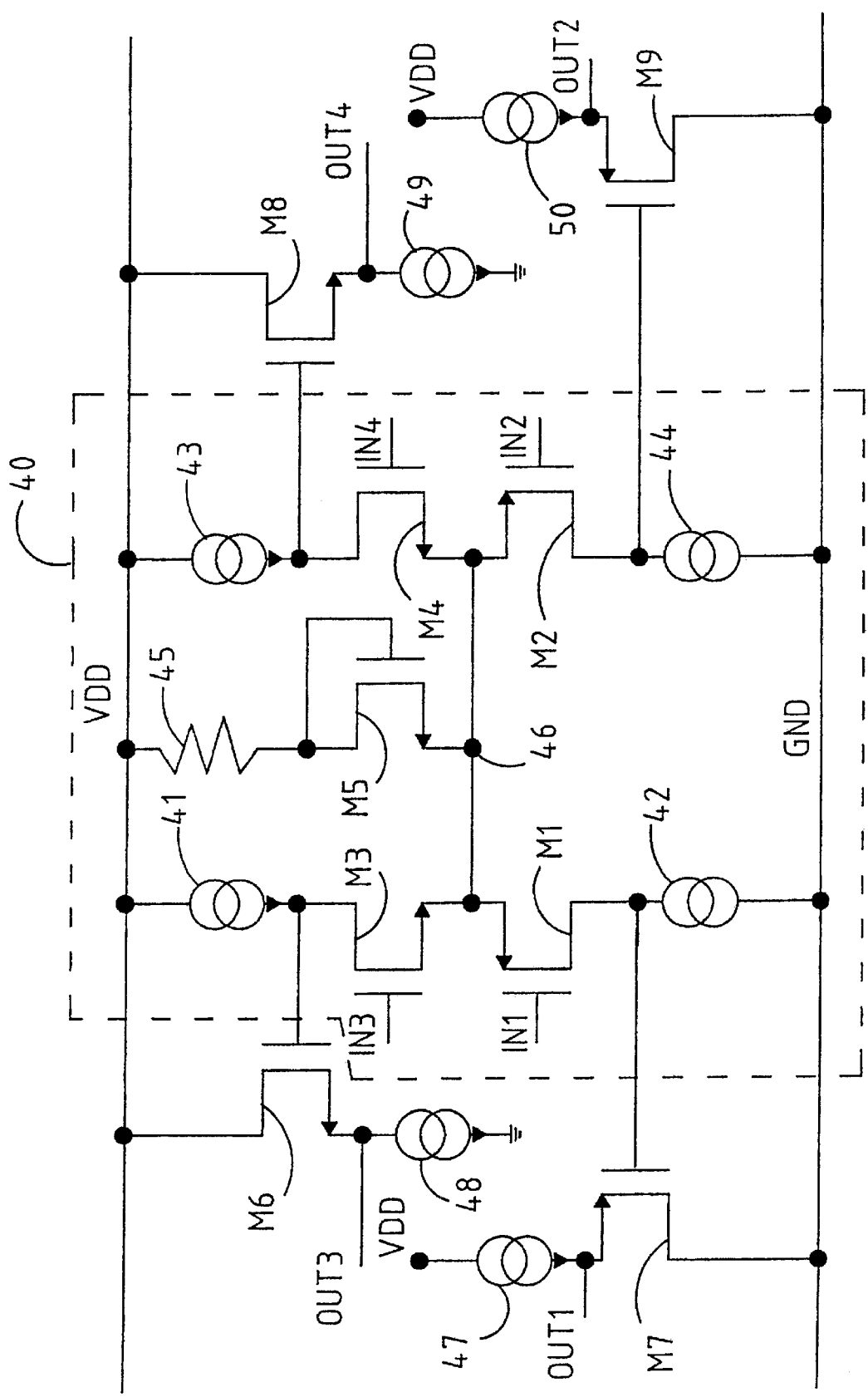
FIG. 4 illustrates a schematic circuit of a second embodiment of an amplifier having four inputs and four outputs according to the present invention.

FIG. 4 illustrates a schematic circuit of a second embodiment of the amplifier 40 having four inputs and four outputs according to the present invention. The elements corresponding to those shown in FIG. 3 have the same numerical references.

In addition to the elements of FIG. 3, in FIG. 4 there is a transistor M6 having the drain connected to the first voltage source VDD and having the source connected to a current generator 48 in turn connected to the second voltage source GND. The gate of the transistor M6 is connected to the drain of the transistor M3, and the output OUT3 is this time taken from the source of the transistor M6. A transistor M7 has a drain connected to the second voltage source GND and has a source connected to a current generator 47, which is in turn connected to the first voltage source VDD. The gate of the transistor M7 is connected to the drain of the transistor M1, and the output OUT1 is this time taken from the source of the transistor M7.

In an analogous configuration for the other symmetrical branch, we find a transistor M8 having a drain connected to the first voltage source VDD and having a source connected to a current generator 49, which is in turn connected to the second voltage source GND. The gate of the transistor M8 is connected to the drain of the transistor M4, and the output OUT4 is this time taken from the source of the transistor M8. A transistor M9 has a drain connected to the second voltage source GND and has a source connected to a current generator 50, which is in turn connected to the first voltage source VDD. The gate of the transistor M9 is connected to the drain of the transistor M2, and the positive output OUT2 is this time taken from the source of the transistor M9.

The transistors M7 and M9 are, for instance, p-channel transistors, and the transistors M6 and M8 are, for instance, n-channel transistors.

As shown in FIG. 4, it is preferable to add the transistors and the current generators on the outputs of the amplifier 40 in order stabilize the output signal. The additional transistors work like voltage followers, and they can be designed so that they consume low current and occupy a small space.

Returning to the amplifier having four inputs and four outputs shown in FIG. 3, it is to be noted that the simple structure allows for a low current consumption and a wide bandwidth. A notable reduction of used silicon area has also been achieved in comparison with the prior circuits. It must be considered that our new circuit has only a small reduction in the DC open loop gain when compared to the known circuits in the art. If we assume the transconductance (gm) of the transistors M1, M2, M3 and M4 to be equal we have:

$$Vout(n)=0.25 \text{ gm } rDS(n) \text{ with } n=1, \ldots, 4 \qquad (1)$$

where rDS is the impedance of the output transistor in consideration. On the other hand, in the conventional circuits we had:

$$Vout(n)=0.5 \text{ gm } rDS(n) \text{ with } n=1, \ldots, 4 \qquad (2)$$

Also, for the circuit of FIG. 3, we have:

$$Vout1-Vout2=K1 \ (VIN1-VIN2)+K2(VIN3-VIN4) \qquad (3)$$

where Vout1 and Vout2 are the output voltages respectively of the output OUT1 and OUT2; VIN1, VIN2, VIN3 and VIN4 are the input voltages of the four inputs, respectively IN1, IN2, IN3, IN4; K1 is a first amplification factor and K2 is a second amplification factor, with K1 greater than K2. K1 is about 26 dB and K2 is about 1 dB.

A similar relationship is valid also for the other two outputs:

$$Vout3-Vout4=K1(VIN3-VIN4)+K2(VIN1-VIN2) \qquad (4)$$

where Vout3 and Vout4 are the output voltages respectively of the output OUT3 and OUT4; VIN1, VIN2, VIN3 and VIN4 are the input voltages of the four inputs, respectively IN1, IN2, IN3, IN4; K1 is a first amplification factor and K2 is a second amplification factor, with K1 greater than K2. K1 is about 26 dB and K2 is about 1 dB.

The resistor 45 and the transistor M5 are used for the biasing of the node 46.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An amplifier having four inputs and four outputs comprising:

a first differential pair composed of a first and a second transistor having drains respectively connected to two output terminals and coupled to a first voltage source by two current generators, the gates of said first and second transistor being coupled to two input terminals;

a second differential pair composed of a third and a fourth transistor having their drains respectively connected to two output terminals and coupled to a second voltage source by two current generators, the gates of said third and fourth transistor being coupled to two input terminals;

the sources of said first, second, third and fourth transistors being connected together; and a voltage generator connected between the first voltage source and said transistor sources.

2. The amplifier according to claim 1, wherein said first and second transistors are n-channel transistors, and said third and fourth transistors are p-channel transistors.

3. The amplifier according to claim 1, wherein said voltage generator is comprised of a resistor in series with a transistor connected like a diode.

4. The amplifier according to claim 1, wherein two of the said inputs are inverting inputs and two of the said inputs are non-inverting inputs.

5. The amplifier according to claim 1, wherein each of said four outputs is coupled to a voltage follower.

6. A single amplifier having four inputs and four outputs, the single amplifier configured for operation with a first portion of a fully differential operational amplifier (FDOA) of the folded cascode type, the first portion of the FDOA configured to be coupled to a pair of first and second operational amplifiers, the first operational amplifier having first and second inputs and first and second outputs, the second operation amplifier having third and fourth inputs and third and fourth outputs, the first portion of the FDOA having IN1, IN2, OUT1, and OUT2 leads configured to be coupled to the first input, second input, first output and second output, respectively, of the first operational amplifier, the first portion of the FDOA having IN3, IN4, OUT3, and OUT4 leads configured to be coupled to the third input, fourth input, third output, and fourth output, respectively, of the second operational amplifier, the single amplifier comprising:

a first transistor including a source, a gate configured to be coupled to the IN1 lead, the drain configured to be coupled to a first device, the first device configured to be coupled to the OUT1 lead;

a second transistor including a source, a gate configured to be coupled to the IN2 lead, the drain configured to be coupled to a second device, the second device configured to be coupled to the OUT2 lead;

a third transistor including a source, a gate configured to be coupled to the IN3 lead, the drain configured to be coupled to a third device, the third device configured to be coupled to the OUT3 lead; and a fourth transistor including a source, a gate configured to be coupled to the IN4 lead, the drain configured to be coupled to a fourth device, the fourth device configured to be coupled to the OUT4 lead; the sources of the first, second, third, and fourth transistors being coupled together.

7. The single amplifier of claim 6 wherein the first and second transistors are of n-channel type and the third and fourth transistors are of p-channel type.

8. The single amplifier of claim 6 wherein the single amplifier is so configured such that when the single amplifier is coupled to the first portion of the FDOA, given a voltage difference between the IN1 lead and the IN2 lead of VIN1−VIN2 and given a voltage difference between the IN3 lead and the IN4 lead of VIN3−VIN4, the voltage difference between the OUT1 lead and the OUT2 lead is substantially equal to K1(VIN1−VIN2)+K2(VIN3−VIN4), K1 and K2 being amplification factors.

9. The single amplifier of claim 6 wherein the first, second, third, and fourth devices are leads configured to be coupled to the OUT1, OUT2, OUT3, and OUT4 leads, respectively.

10. The single amplifier of claim 6 wherein the first, second, third, and fourth devices are first, second, third, and fourth voltage followers, respectively, configured to be coupled to the OUT1, OUT2, OUT3 and OUT4 leads, respectively.

11. The single amplifier of claim 10 wherein the voltage followers each comprise a transistor and a current generator pair, each transistor having a source, a drain, and a gate, each current generator having first and second leads, the gates of the transistors of the first, second, third, and fourth voltage followers being coupled to drains of the first, second, third, and fourth transistors, respectively, the drains of the transistors of the first and second voltage followers being coupled to a first voltage source, the drains of the transistors of the third and fourth voltage followers being coupled to a second voltage source, the sources of the transistors of the first and second voltage followers being coupled to the first lead of the current generators of the first and second voltage followers, respectively, the sources of the transistors of the third and fourth voltage followers being coupled to the second leads of the current generators of the third and fourth voltage followers, respectively, the second leads of the current generators of the first and second voltage followers being coupled to the second voltage source, the first leads of the current generators of the third and fourth voltage followers being coupled to the first voltage source.

12. The single amplifier of claim 6, further including first and second voltage sources.

13. The single amplifier of claim 12, further including first and second current generators coupled to the first voltage source and third and fourth current generators coupled to the second voltage source.

14. The single amplifier of claim 13 wherein the drains of the first, second, third, and fourth transistors are coupled to the first, second, third, and fourth current generators, respectively.

15. The single amplifier of claim 12, further including a resistor and a fifth transistor having a source, drain and gate, the resistor having first and second resistor leads, the first resistor lead coupled to the first voltage source, the second resistor lead being coupled to the drain and gate of the fifth transistor, the source of the fifth transistor being coupled to the sources of the first, second, third, and fourth transistors.

16. A single amplifier having four inputs and four outputs, the single amplifier comprising:

a first transistor including a source, a gate configured to be coupled to a first input lead, the drain configured to be coupled to a first device, the first device configured to be coupled to a first output lead;

a second transistor including a source, a gate configured to be coupled to a second input lead, the drain configured to be coupled to a second device, the second device configured to be coupled to a second output lead;

a third transistor including a source, a gate configured to be coupled to the third input lead, the drain configured to be coupled to a third device, the third device configured to be coupled to a third output lead; a fourth transistor including a source, a gate configured to be coupled to a fourth input lead, the drain configured to be coupled to a fourth device, the fourth device configured to be coupled to a fourth output lead; the sources of the first, second, third, and fourth transistors being coupled together;

first and second voltage sources; and a resistor and a fifth transistor having a source, drain and gate, the resistor having first and second resistor leads, the first resistor lead coupled to the first voltage source, the second resistor lead being coupled to the drain and gate of the fifth transistor, the source of the fifth transistor being coupled to the sources of the first, second, third, and fourth transistors.

17. The single amplifier of claim 16 wherein the first and second transistors are of n-channel type and the third and fourth transistors are of p-channel type.

18. The single amplifier of claim 16 wherein the single amplifier is so configured such that given a voltage difference between the first input lead and the second input lead of VFIRST INPUT−VSECOND INPUT and given a voltage difference between the third input lead and the fourth input lead of VTHIRD INPUT−VFOURTH INPUT, the voltage difference between the first output lead and the second output lead is substantially equal to K1(VFIRST INPUT−VSECOND NPUT)+K2(VTHIRD IPUT−VFOURTH INPUT), K1 and K2 being amplification factors.

19. The single amplifier of claim 18 wherein K1 and K2 are positive and K1 is greater than K2.

20. The single amplifier of claim 16 wherein the first, second, third, and fourth devices are leads configured to be coupled to the first, second, third, and fourth output leads, respectively.

21. The single amplifier of claim 16 wherein the first, second, third, and fourth devices are first, second, third, and fourth voltage followers, respectively, configured to be coupled to the first, second, third, and fourth output leads, respectively.

22. The single amplifier of claim 16, further including first and second current generators coupled to the first voltage source and third and fourth current generators coupled to the second voltage source.

23. The single amplifier of claim 22 wherein the drains of the first, second, third, and fourth transistors are coupled to the first, second, third, and fourth current generators, respectively.

* * * * *

UNITED STATES PATENT AND TRADEMARK OFFICE
CERTIFICATE OF CORRECTION

PATENT NO. : 6,496,066 B2
DATED : December 17, 2002
INVENTOR(S) : Vittorio Colonna et al.

It is certified that error appears in the above-identified patent and that said Letters Patent is hereby corrected as shown below:

Column 8,
Lines 1 and 2, "K1(VFIRST INPUT – VSECONI) NPUT) + K2(VTHIRD IPUT – VFOURTH INPUT)," should be corrected to read as -- K1(VFIRST INPUT – VSECOND INPUT) + K2(VTHIRD INPUT – VFOURTH INPUT), --.

Signed and Sealed this

Third Day of June, 2003

JAMES E. ROGAN
*Director of the United States Patent and Trademark Office*